United States Patent [19]

Quad et al.

[11] Patent Number: 4,967,081
[45] Date of Patent: Oct. 30, 1990

[54] INFRARED DETECTOR

[75] Inventors: Reiner Quad, Taunusstein; Udo Ringelstein, Lorch; Fred Plotz, Wiesbaden; Gerhard Knaup, Lorsch, all of Fed. Rep. of Germany

[73] Assignee: Heimann GmbH, Fed. Rep. of Germany

[21] Appl. No.: 366,613

[22] Filed: Jun. 15, 1989

[30] Foreign Application Priority Data

Jun. 23, 1988 [DE] Fed. Rep. of Germany ... 8808109[U]
Jul. 8, 1988 [DE] Fed. Rep. of Germany ... 8808815[U]

[51] Int. Cl.$^5$ .......................... H05K 9/00; G01J 5/04
[52] U.S. Cl. .............................. 250/338.1; 250/338.3; 250/338.4; 357/70
[58] Field of Search ................... 250/338.3, 338.4, 342, 250/338.1; 357/70, 72, 74

[56] References Cited

U.S. PATENT DOCUMENTS

| | | | |
|---|---|---|---|
| 4,047,045 | 9/1977 | Paxton, Jr. et al. | 250/551 |
| 4,055,761 | 10/1977 | Shimomura | 250/239 |
| 4,198,564 | 4/1980 | Baker et al. | 250/338.3 |
| 4,293,768 | 10/1981 | Adachi et al. | 250/338.3 |
| 4,322,628 | 3/1982 | Tanaka | 250/551 |
| 4,650,998 | 3/1987 | Martin | 250/239 |

FOREIGN PATENT DOCUMENTS

| | | | |
|---|---|---|---|
| 0184747 | 6/1986 | European Pat. Off. | |
| 0187180 | 7/1986 | European Pat. Off. | 250/342 |
| 58-4953 | 1/1983 | Japan. | |
| 2107929 | 5/1983 | United Kingdom. | |

*Primary Examiner*—Constantine Hannaher
*Attorney, Agent, or Firm*—Hill, Van Santen, Steadman & Simpson

[57] ABSTRACT

An infrared detector has two infrared detector elements contained in a housing, the housing having a window which is transmissive for infrared radiation, and further electrical components interconnected with the detector elements are also contained in the housing. The housing is formed of a shaped plastic part in which a shaped sheet metal element and the electrical components are embedded. The shaped sheet metal component electrically connects the electrical components, and is provided with outward projections serving as the exterior terminal pins. The shaped sheet metal component has angled regions which are bent to surround at least a portion of the electrical components for shielding thereof.

3 Claims, 3 Drawing Sheets

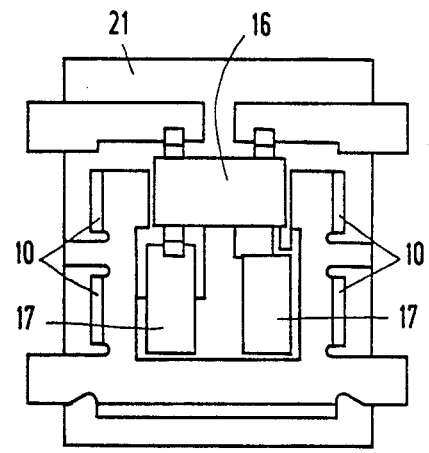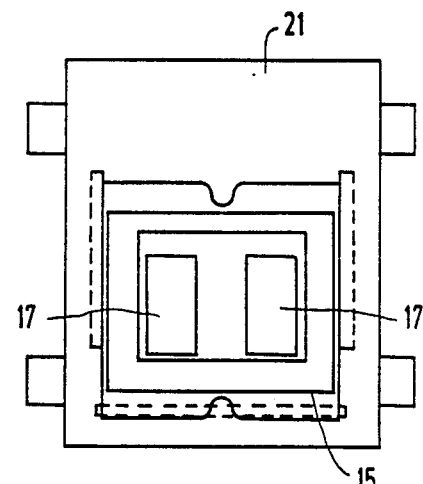
FIG 4          FIG 5
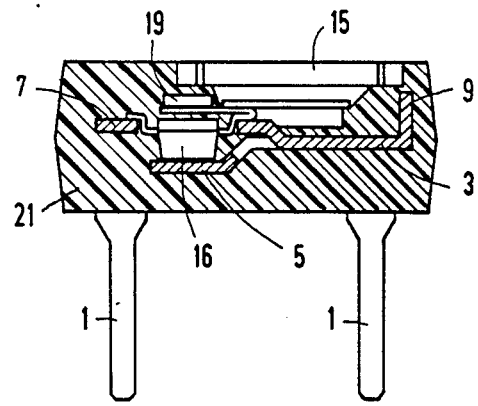
FIG 6
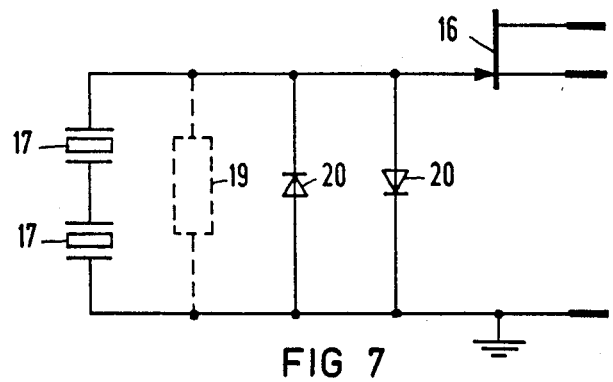
FIG 7

INFRARED DETECTOR

BACKGROUND OF THE INVENTION

1. Field of the Invention

The present invention relates to an infrared detector of the type suitable for use in burglar alarm systems and automatic light switches.

2. Description of the Prior Art

Infrared detectors are generally known in the art which include at least one detector element mounted in a housing which has a window covering the detector element which is transmissive for infrared radiation. The housing also contains further electrical components interconnected with the detector element.

Infrared detectors of this type using pyroelectric detector elements are principally used in burglar alarm systems and automatic light switches. It is known that the temperature of a human body is usually different from the environment. A person moving in the field of view of an infrared detector causes a change in the radiant power incident on the detector element, and thus the temperature of the detector element also changes. This results in a spontaneous polarization of the detector material, due to the pyroelectric effect, resulting in the generation of charge. The charge is acquired at electrodes of the detector, and is shaped into a voltage signal using an impedance converter. A field effect transistor having a low gate leakage current is generally used as the impedance converter.

In conventional infrared detectors of the type described above, the window which is transmissive for infrared radiation is glued in a metallic housing cover. The electrical components and the detector are mounted on a plate in another housing portion, which is then closed by the cover, and the two housing parts are tightly joined to one another.

In conventional infrared detectors, therefore, a disadvantage exists that automatic checking and positioning of the detector element relative to other components of the device can only be undertaken to a limited degree, or only with relatively complicated specialized equipment.

SUMMARY OF THE INVENTION

It is an object of the present invention to provide an infrared detector of the type described above having a structure which permits the device to be assembled with simplicity.

It is a further object of the present invention to provide such an infrared detector having a higher reliability due to the ability to perform automated, standardized testing procedures on the device during assembly.

The above objects are achieved in accordance with the principles of the present invention in an infrared detector having a housing formed of a shaped plastic part, in which a shaped metal part, as well as all electrical components, are embedded. The shaped metal part electrically joins the components, and is provided with outward projections for making an electrical connection as the external terminal pins of the finished device. The shaped plastic part is provided with steps for acceptance of the detector element and of an infrared filter. A defined optical alignment of the detector, without the necessity of auxiliary adjustment steps, is ensured, because the projections serving as the to the terminal pins are oriented in a known manner relative to the housing, as are the infrared detector and the infrared filter, therefore the infrared detector and the infrared filter are also automatically oriented relative to the projections, and thus to the terminal pins. Standard assembly devices can be used.

A thin lamina consisting of a ceramic or a crystal is used as the pyroelectric material for the detector element. Electrodes which form two separate capacitors are applied on the surface of this lamina. These capacitors are connected either in series or in parallel with opposite polarity. A serial connection is preferred for the structure of the present invention. In this serial connection, the electrodes are connected at the side facing toward the incoming radiation, and may additionally be provided with a layer which absorbs infrared radiation.

As is standard for electrical components encapsulated in plastic, the construction of the infrared detector proceeds starting from a contact "spider" which is stamped or otherwise formed from a blank of sheet metal. The spider contains the mounting and contact surfaces for the components parts and also includes the terminal contacts for the subsequently attached infrared detector. The terminal contacts are connected to supporting webs so that the spider can be taken from a continuous roll of spiders. The high impedance of the detector elements makes it necessary to achieve a complete, conductive encapsulation of these detector elements and of the field effect transistor. As noted above, for this reason metal housings were substantially exclusively used in conventional devices. In the present invention, portions of a central, shaped panel of the spider are bent upwardly, and thus form a portion of a shielding cage for the detector, and also provide a base for the detector. It is thus not necessary that the housing consist of shielding material, therefore a metal housing is not needed. An encapsulated field effect transistor can be used as the impedance converter.

The terminals of the shaped metal spider for the source, drain and ground connections to the field effect transistor are bent into different planes, and are shaped so as to form a pocket together with the central panel, in which the field effect transistor can be positioned. This permits a simple assembly.

The plastic housing is formed by injection molding with duroplastics or thermoplastics, during which an opening is left in the housing through which the sensor element, which is sensitive to high temperatures, is subsequently mounted. Seating and positioning surfaces are thereby formed by appropriately bending the spider and during the encapsulation. Additionally, the formed plastic part has an edge around the opening for the detector element in which the protective window is glued.

The central panel of the spider is shaped with upright portions terminating adjacent the edge in which the window is received. If a conductive glue is used to hold the window, a closed shielding cage is thereby formed.

The structure discloses herein permits automatic assembly of the infrared detector using fabrication systems which have proven themselves reliable over long periods of use in semiconductor chip fabrication.

By adding further terminals and thus lengthening the housing, it is possible to integrate in the same structure the switch elements which are needed for use of the infrared detector in an alarm device or an automatic light switch.

DESCRIPTION OF THE DRAWINGS

FIG. 4 is a view as seen from the inside of an assembled infrared detector constructed in accordance with the principles of the present invention.

FIG. 5 is an external plan view of an infrared detector constructed in accordance with the principles of the present invention.

FIG. 6 is a side sectional view of a further embodiment of an infrared detector constructed in accordance with the principles of the present invention.

FIG. 7 is a circuit diagram showing the circuit which is realized in the structures shown in FIGS. 2 through 6.

DESCRIPTION OF THE PREFERRED EMBODIMENTS

An infrared detector is described herein having the components shown in the basic circuit diagram of FIG. 7. The infrared detector includes two detector elements 17, and may include a bleed resistor 19 with two diodes 20, connected with opposite polarity, having leakage currents in the picoampere range. A field effect transistor 16 serves as an impedance converter.

FIGS. 2 through 6 show an infrared detector comprising the above components in a plastic-injected housing having four terminal contacts. Two of the terminal contacts are for the source and drain of the field effect transistor, and the two other contacts are for a connection to ground.

Figure 1:
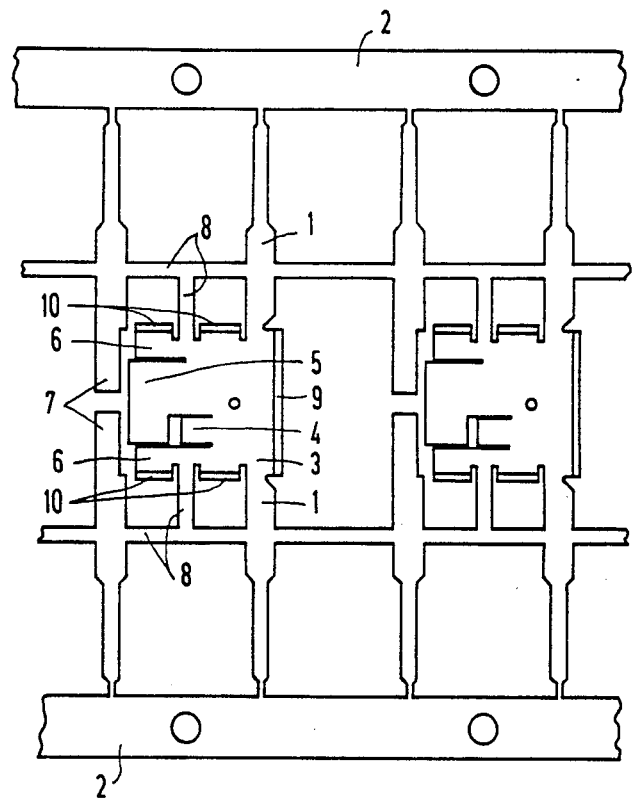
FIG. 1 is plan view of a contact spider used in the manufacture of an infrared detector in accordance with the principles of the present invention.

The structure of the infrared detector proceeds on the basis of a contact spider as shown in FIG. 1. The contacts 1, which will be connected to ground, are connected to a holding and positioning strip 2 at both sides, and to a central shaped sheet metal portion 3. A tab 4 of sheet metal is bent out of the plane of the central portion 3 in an upward direction, the tab 4 serving to contact and support the ground terminal of the field effect transistor 16. A further tab 5 of sheet metal is bent downwardly, which provides the shielding beneath the field effect transistor 16. The width of the central portion 3 is dimensioned such that two positioning webs 6 for the field effect transistor 16 are provided at both sides.

Two sheet metal projections 17 in the same plane as the contacts 1 provide the connection for the source and drain.

Retaining webs 8, which are cut off after encapsulation, provide reinforcement during assembly. Further sheet metal tabs 9 and 10 are bent perpendicularly upwardly at three sides of the central portion 3, forming lateral shielding. The tabs 10 also provide the connection to the infrared window or filter 15 which closes the shielding cage.

The encapsulated field effect transistor 16, including integrated diodes 20, is positioned in the pocket formed in the contact spider. The source, drain and ground terminals are respectively attached to the sheet metal tabs 4 or 7 by welding or soldering. The gate terminal of the field effect transistor 16 is freely suspended, and serves for later contacting to the detector element 17.

Figure 2:
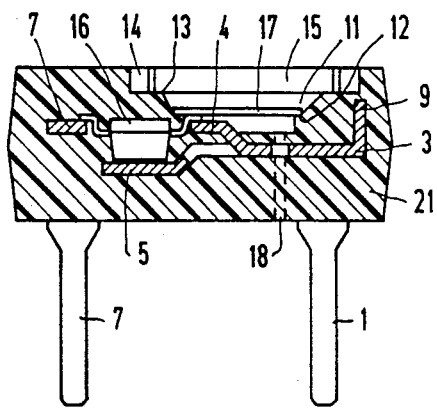
FIG. 2 is a side sectional view of an infrared detector constructed in accordance with the principles of the present invention.

After mounting the field effect transistor 16, the structure shown in FIGS. 2 through 5 can be encapsulated in a known manner with duroplastics or thermoplastics in a multiple casting machine. An opening 11, by which the ground contact and the gate contact of the field effect transistor 16 are exposed, is provided in the housing during encapsulation, as shown in FIG. 2. This opening has a step 12 at the edge thereof in a plane containing the field effect transistor contacts. The step 12 is provided to accept the detector elements 17 The wall of the step 12 slopes downwardly toward the location at which the detector elements 17 are to be positioned, so that the detector elements 17 are automatically positioned after they are introduced into the housing. The contacts to the ground and gate terminals of the field effect transistor 16 are either soldered or glued in conductive fashion.

The resistor 19, if used, can be contacted from below with the contact surfaces on the ground and gate terminal contact of the field effect transistor 16, as shown in FIG. 6. The resistor 19 functions as a gate bleeder resistor, and is applied on an aluminum oxide substrate. As shown in FIG. 6, the resistor 19 is mounted above the field effect transistor 16. It is also possible to mount the resistor 19 at the bottom of the housing opening. In the latter case, the resistor 19 will be connected to the ground and gate terminal of the field effect transistor 16 in an upward direction.

Figure 3:
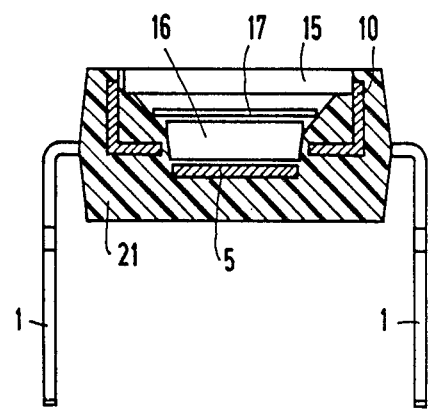
FIG. 3 is a further sectional view, taken perpendicularly to the sectional view of FIG. 2, of an infrared detector constructed in accordance with the principles of the present invention.

At its upper edge, the housing opening has a further step 13, which accepts the infrared filter 15. When the filter 15 is placed on the step 13, there will be a continuous free space 14 along the longer sides of the filter 15. The free spaces 14 form a reservoir for conductive glue which is used to close the housing. The sheet metal tabs 10 of the central portion 3 projection into the step 13, as shown in FIGS. 3 and 4.

A small opening in the bottom of the housing permits degasification when the glue cures, the opening 18 being subsequently closed.

The housing is then filed with nitrogen and is sealed, and the holding webs 8 are cut off. The terminal legs (the ground contacts 1 and the sheet metal projections 7) are cut from the holding and positioning strip 2, and are bent 90° in a downward direction.

Figure 8:
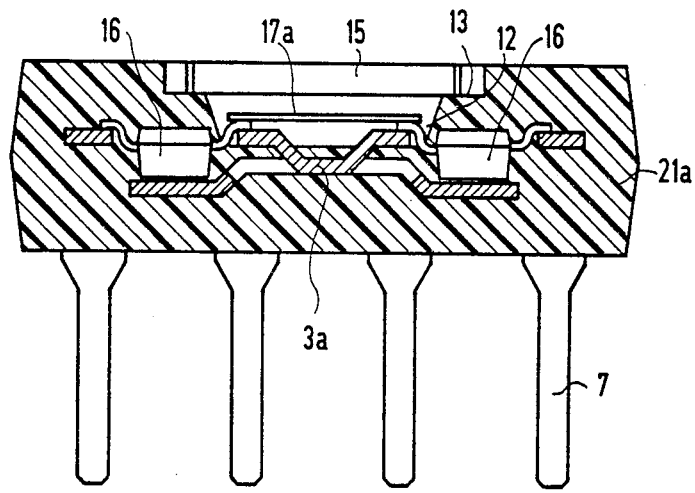
FIG. 8 is a side sectional view of another embodiment of an infrared detector constructed in accordance with the principles of the present invention.

A four element infrared detector is shown in FIG. 8, having two field effect transistors 16, each mounted as described above, the embodiment of FIG. 8 uses two dual detector elements 17a, which operate independently of each other, and are also mounted in the housing as described above. The assembly of the embodiment of FIG. 8 proceeds as described above, with a spider having a modified central portion 3a.

The embodiments shown in FIGS. 2 through 6 and 8 have in common the formation of the housing by a shaped plastic part 21 or 21a, in which a central sheet metal portion 3 or 3a and components 16, 17 or 17a (and possibly resistors 19 and 20) are embedded. The shaped sheet metal portion 3 or 3a electrically connects the components 16, 17 or 17a (and possibly resistors 19 and 20), and is provided with outwardly projecting legs, such as the ground contact 1 and the projections 7 for the electrical connection of the infrared detector. Both embodiments have steps 12 and 13 in the housing for accepting the detector elements 17 or 17a, and the infrared filter 15. Both embodiments have bent tabs, such as the tabs 4, 5, 9 and 10 which surround the components 16, 17 or 17a (and possibly resistors 19 and 20) for shielding.

Although modifications and changes may be suggest by those skilled in the art it is the intention of the inventors to embody within the patent warranted hereon all changes and modifications as reasonably and properly come within the scope of their contribution to the art.

We claim as our invention:

1. An infrared detector comprising:
   an infrared detector element;
   an electrical component used in combination with said infrared detector element to provide a signal corresponding to infrared radiation incident on said infrared detector element;
   a one-piece shaped sheet metal element having a plurality of projections disposed in mechanical contact with said infrared detector element and said electrical component to electrically connect said infrared detector element and said electrical component;
   an infrared filter; and
   a shaped plastic housing in which said infrared detector element, said electrical component and said sheet metal element are embedded with a portion of said plurality of projections extending outside of said housing to form terminal pins for said infrared detector, said housing having an opening therein with stepped walls which hold said infrared detector element and said infrared filter with said infrared detector element disposed behind said infrared filter at a fixed location.

2. An infrared detector comprising:
   an infrared detector element;
   an electrical component used in combination with said infrared detector element to provide a signal corresponding to infrared radiation incident on said infrared detector element;
   a one-piece shaped sheet metal element having a plurality of projections disposed in mechanical contact with said infrared detector element and said electrical component to electrically connect said infrared detector and said electrical component, said one-piece shaped sheet metal element also having a plurality of tabs bent to surround said infrared detector element and said electrical component for shielding;
   an infrared filter; and
   a shaped plastic housing in which said infrared detector element, said electrical component and said sheet metal element are imbedded with a portion of said plurality of projections extending outside of said housing to form terminal pins for said infrared detector, and said housing having an opening therein with stepped walls which hold said detector element and said infrared filter with said infrared detector element disposed behind said infrared filter at a fixed location.

3. An infrared detector as claimed in claim 2, wherein said tabs of said one-piece shaped sheet metal element extend to a level in said shaped plastic housing co-planar with said infrared filter, and said infrared detector further comprising conductive glue at least partially surrounding said filter and contacting said tabs.

* * * * *